(12) United States Patent
Chen et al.

(10) Patent No.: US 9,814,166 B2
(45) Date of Patent: *Nov. 7, 2017

(54) METHOD OF MANUFACTURING ELECTRONIC PACKAGE MODULE

(71) Applicant: UNIVERSAL SCIENTIFIC INDUSTRIAL ( SHANGHAI) CO., LTD., Shanghai (CN)

(72) Inventors: Jen-Chun Chen, Nantou County (TW); Tsung-Jung Cheng, Nantou County (TW); Chia-Cheng Liu, Nantou County (TW)

(73) Assignee: UNIVERSAL SCIENTIFIC INDUSTRIAL (SHANGHAI) CO., LTD., Shanghai (CN)

(*) Notice: Subject to any disclaimer, the term of this patent is extended or adjusted under 35 U.S.C. 154(b) by 887 days.

This patent is subject to a terminal disclaimer.

(21) Appl. No.: 13/955,149

(22) Filed: Jul. 31, 2013

(65) Prior Publication Data

US 2015/0035201 A1    Feb. 5, 2015

(51) Int. Cl.
*H01L 21/56* (2006.01)
*H05K 9/00* (2006.01)
(Continued)

(52) U.S. Cl.
CPC ............ *H05K 9/0024* (2013.01); *H01L 21/56* (2013.01); *H01L 23/3114* (2013.01); *H01L 23/552* (2013.01); *H01L 24/02* (2013.01); *H01L 27/14618* (2013.01); *H05K 3/288* (2013.01); *H01L 2924/0002* (2013.01); *H05K 1/0224* (2013.01); *H05K 2201/0707* (2013.01); *H05K 2201/1056* (2013.01);
(Continued)

(58) Field of Classification Search
CPC ............... H01L 21/56; H01L 23/49805; H01L 23/3121; H01L 23/3114; H01L 23/522; H01L 23/552; H01L 27/144; H01L 24/02; H05K 9/0024

See application file for complete search history.

(56) References Cited

U.S. PATENT DOCUMENTS 5,314,709 A    5/1994   Doany et al.
8,030,750 B2  10/2011   Kim et al.
(Continued)

FOREIGN PATENT DOCUMENTS

CN    102074516 A    5/2011
CN    103053021 A    4/2013
(Continued)

OTHER PUBLICATIONS

Office Action and Search Report for Chinese Patent Application No. 201410072755.2, dated Aug. 24, 2016, 6 pages.
(Continued)

*Primary Examiner* — Savitr Mulpuri
(74) *Attorney, Agent, or Firm* — Foley & Lardner LLP; Cliff Z. Liu

(57) ABSTRACT

A method of manufacturing electronic package module is provided. The method provides selective molding by attaching tapes on the circuit substrate on which electric components are mounted thereon, forming molding compound to cover the circuit substrate, and removing tapes along with the molding compound thereon.

4 Claims, 6 Drawing Sheets

(51) Int. Cl.
*H01L 23/00* (2006.01)
*H01L 23/31* (2006.01)
*H01L 23/552* (2006.01)
*H01L 27/146* (2006.01)
*H05K 3/28* (2006.01)
*H05K 1/02* (2006.01)

(52) U.S. Cl.
CPC ............... *H05K 2203/0191* (2013.01); *H05K 2203/107* (2013.01); *H05K 2203/1105* (2013.01)

(56) References Cited

U.S. PATENT DOCUMENTS

| | | |
|---|---|---|
| 2006/0152913 A1 | 7/2006 | Richey et al. |
| 2010/0078822 A1 | 4/2010 | Bauer et al. |
| 2010/0314755 A1 | 12/2010 | Kang et al. |
| 2012/0292772 A1 | 11/2012 | Yorita et al. |
| 2013/0049205 A1* | 2/2013 | Meyer ................ H01L 23/3107 257/773 |
| 2013/0155639 A1 | 6/2013 | Ogawa et al. |
| 2014/0190930 A1 | 7/2014 | Mayo et al. |

FOREIGN PATENT DOCUMENTS

| | | |
|---|---|---|
| EP | 1 178 712 A2 | 2/2002 |
| JP | 2007-059846 | 3/2007 |
| JP | 2012-159935 | 8/2012 |
| TW | 201119003 A1 | 6/2011 |
| WO | WO-2012/023332 | 2/2012 |

OTHER PUBLICATIONS

Office Action dated Mar. 3, 2015 on Taiwanese Application No. 103105827 dated Sep. 29, 2014, 5 pages.
Office Action on counterpart Japanese Patent Application No. 2014-156811 dated Jul. 7, 2015, 2 pages.
Non-Final Office Action for U.S. Appl. No. 14/332,970, dated Feb. 8, 2017.
Final Office Action for corresponding U.S. Appl. No. 14/332,970, dated Aug. 10, 2017, 16 pages.

* cited by examiner

METHOD OF MANUFACTURING ELECTRONIC PACKAGE MODULE

BACKGROUND OF THE INVENTION

1. Field of the Invention

The instant disclosure relates to a method of manufacturing electronic package module; in particular, to a method of manufacturing electronic package module providing selective molding.

2. Description of Related Art

Many electronic package modules typically include a circuit substrate and a plurality of electronic components, such as chip packages or passive components, mounted on the circuit substrate. Moreover, majority of the electronic package modules typically include molding compound to encapsulate the electronic components for protection.

However, certain electronic components, especially optical components such as CMOS image sensor (CIS), charge-coupled device (CCD), similar types of image sensors, light emitting diodes (LEDs), or similar types of light emitting elements, are not preferred to be encapsulated with molding which can impact normal operations of the circuit.

To address the above issues, the inventor strives via associated experience and research to present the instant disclosure, which can effectively improve the limitation described above.

SUMMARY OF THE INVENTION

The object of the instant disclosure is to provide a method of manufacturing electronic package module which can selective mold over electronic components.

In order to achieve the aforementioned objects, according to an embodiment of the instant disclosure, the method of manufacturing electronic package module includes the steps of providing a circuit substrate including: a mountable surface, at least one ground pad and at least one patterned predetermined region. The patterned predetermined region is defined on the mountable surface, and the ground pad is proximate to the predetermined region. At least one electronic component is mounted on at least one portion of the mountable surface other than the predetermined region. At least one tape is attached in the patterned predetermined region conforming to the shape of the patterned predetermined region. A molding is formed over the mountable surface. The molding covers the tape and the at least one electronic component. The molding formed on the patterned predetermined region is removed, and then the tape is removed.

According to one preferred embodiment of the instant disclosure, in the step of removing the molding includes the step of laser-scribing at least one groove correspondingly to the patterned predetermined region on the molding above the ground pad.

According to another preferred embodiment of the instant disclosure, in the step of removing the molding includes the step of trimming the molding above the predetermined region with laser-scribing.

According to another preferred embodiment of the instant disclosure, in the step of removing the tape on the predetermine region, heat is provided to facilitate the removal of the tape.

According to another preferred embodiment of the instant disclosure, the tape is an ultraviolet tape and in the step of removing the tape from the predetermined region, the tape is radiated by ultraviolet rays to remove the tape.

By applying the instant disclosure, selective molding is provided only to portion or portions which need molding and metal coating formed thereon. The method can be applied without opening new molding or performing complex steps while providing electromagnetic disturbance (EMI) shielding and keeping optical components from being encapsulated which can affect normal operations.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

Figure 1:
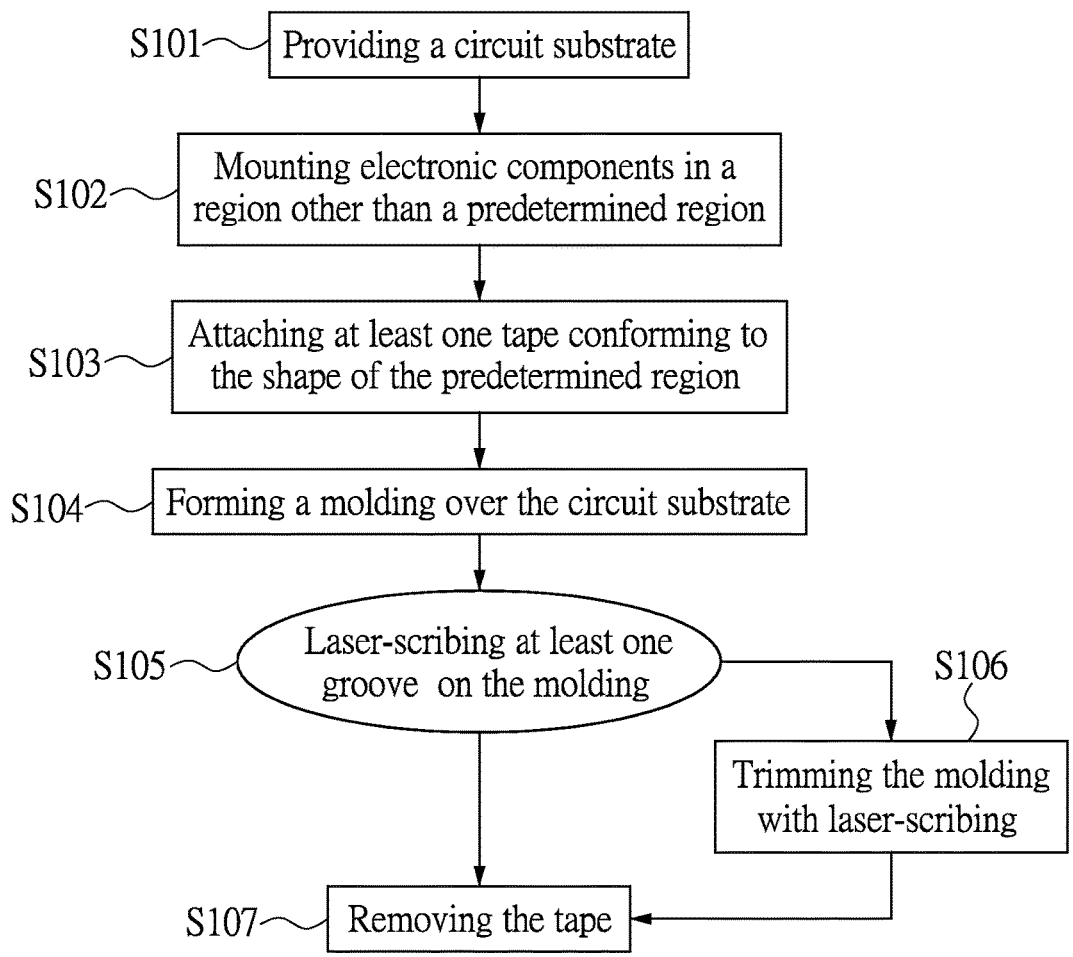
FIG. 1 is a schematic flow diagram of a method of manufacturing electronic package module in accordance with an embodiment of the instant disclosure.

Please refer to FIG. 1 as a schematic flow diagram of a method of manufacturing electronic package module in accordance with an embodiment of the instant disclosure. Please refer to FIGS. 2A to 2H in conjunction with FIG. 1. FIGS. 2A, 2C, 2E, and 2G are cross-section views of the electronic package module illustrating the method of manufacturing electronic package module in accordance with an embodiment of the instant disclosure. FIGS. 2B, 2D, 2F, and 2H are overhead views of the electronic package module illustrating the method of manufacturing electronic package module in accordance with an embodiment of the instant disclosure.

Figure 2A:
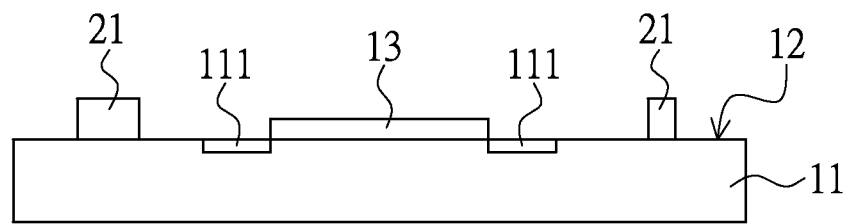
FIG. 2A to 2I are schematic diagrams illustrating the method of manufacturing electronic package module in accordance with an embodiment of the instant disclosure.
Figure 2B:
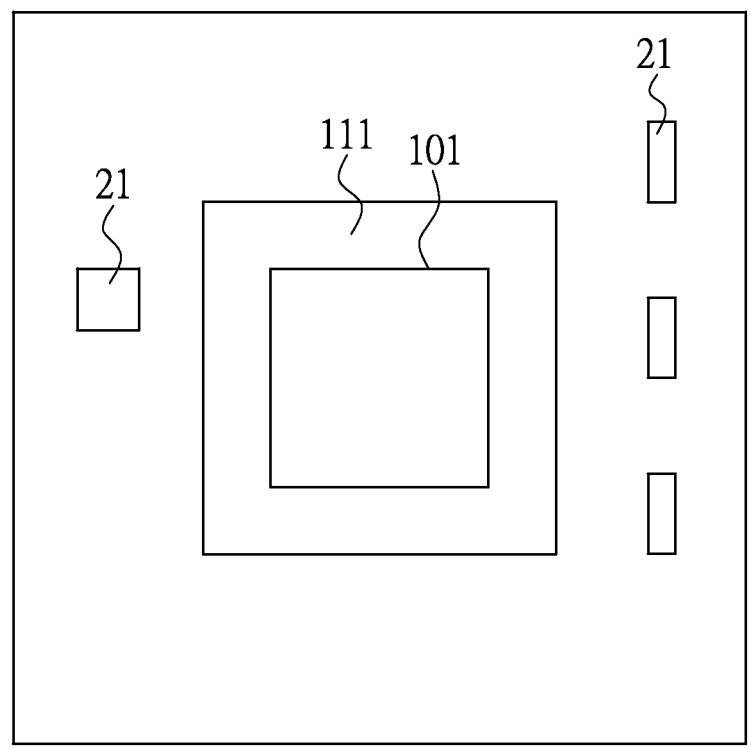
Figure 2C:
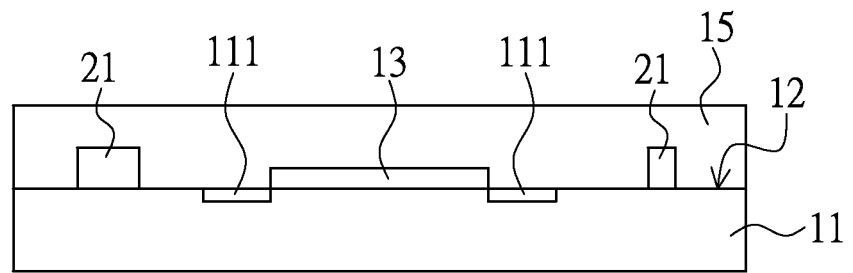
Figure 2D:
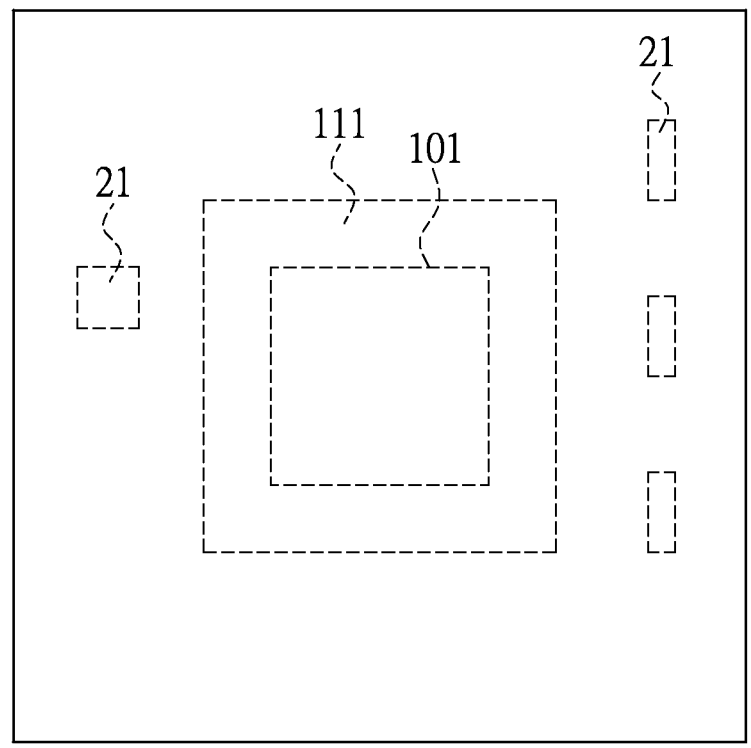

Please refer to FIGS. 1, 2A, and 2B as an embodiment of the method. A circuit substrate 11 is provided (Step S101). The circuit substrate 11 has a mountable surface 12, at least one predetermined region 101 defined on the mountable surface 12, and at least one ground pad 111. The ground pad 111 surrounds the periphery of the predetermined region 101 as an example of the instant embodiment, but not limited herein. The ground pad 111 can be of various sizes, shapes, and dimensions depending on the preference of the design. Moreover, electronic components 21 are mounted on any portions of the mountable surface 12 other than the predetermined region 101 (Step S102). The mountable surface can use surface mount technology (SMT) to mount non-optical electronic components 21 such as discrete passive components, but not limited to examples provided herein.

Figure 3:
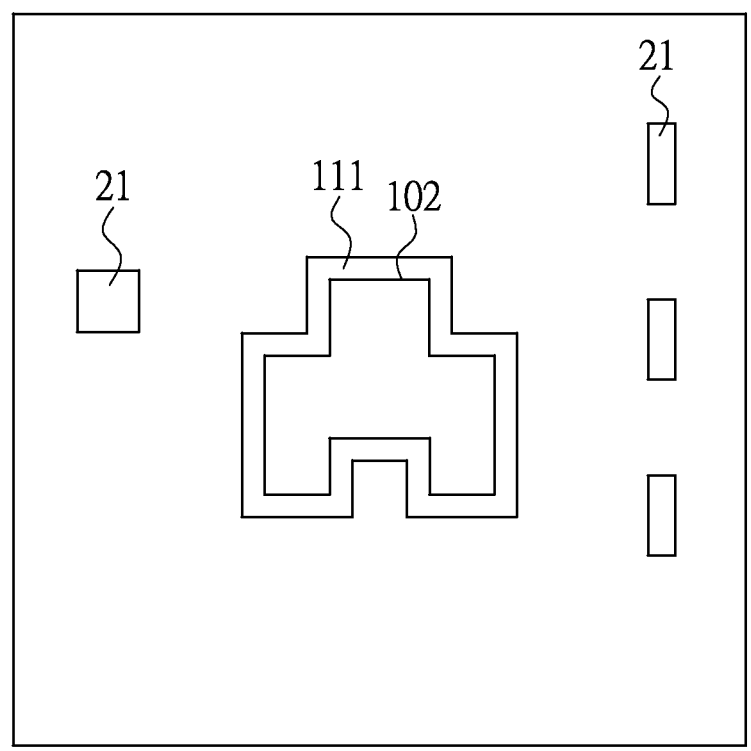
FIG. 3 is a schematic diagram illustrating the method of manufacturing electronic package module being applied on an exemplary predetermined region in accordance with another embodiment of the instant disclosure.

Please refer to FIG. 3. The predetermined region 102 in the instant embodiment can be a patterned predetermined region 102 as shown in FIG. 3. In other words, the shape of the predetermined region 102 is not limited to the examples of the embodiments provided herein. Thus, the quantity, surface area, size and shape of the predetermined region are not limited. The predetermined region facilitates access to positions of electronic components, such as CMOS, CCD, or other types of image sensors, or light emitting components (LEDs, etc), that may have been covered by molding 15 post regular manufacturing processes.

Please refer to FIGS. 1, 2A, 2B, 2C, and 2D. At least one piece of tape is attached on the circuit substrate 11 in the predetermined region 101 (Step 103). Thereafter, molding 15 is formed over the entire circuit substrate 11 (Step 104). The molding 15 encapsulates both the tape 13 and circuit substrate 11, and further encapsulates electronic components 21 and ground pads 111 which are mounted on portions of the circuit substrate 11 besides the predetermined region 101. Specifically, the molding 15 is formed by transfer molding or compression molding. The tape 13 can be attached to partially cover the ground pads 111 or not cover the ground pads 111 nearby, but is not limited herein.

Figure 2E:
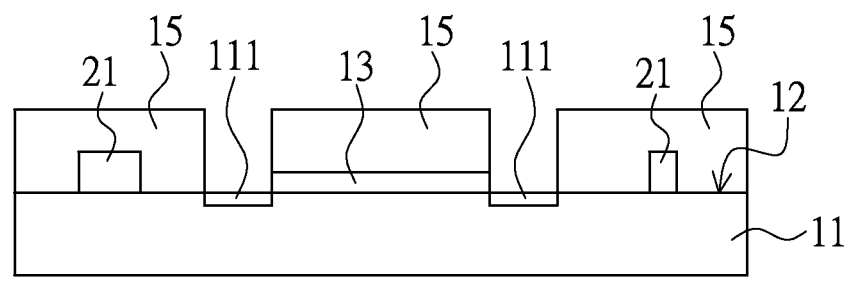
Figure 2F:
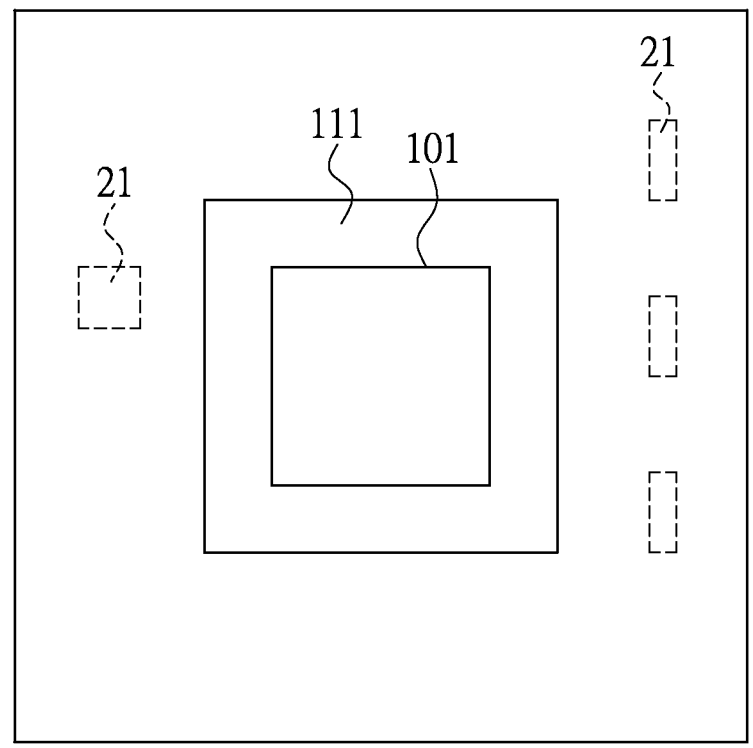

Please refer to FIGS. 1, 2E, and 2F. After the molding 15 is formed, at least one groove is formed at portions of the molding 15 surrounding the patterned predetermined region 101 (Step 105). In other words, the groove is cut along the ground pad 111. The ground pad 111 is a metal layer and the molding 15 is commonly made of resins. As a result, laser cutting is ceased at the ground pad 111 due to the difference in the degree of laser absorption between the ground pad 111 and the molding 15 materials. As long as the molding 15 is cut and the circuit substrate 11 remains, the steps are not limited herein. For example, the groove can be formed on the molding 15 by routing.

Figure 2G:
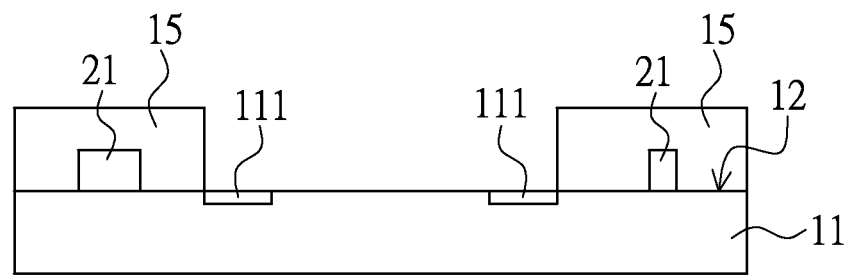
Figure 2H:
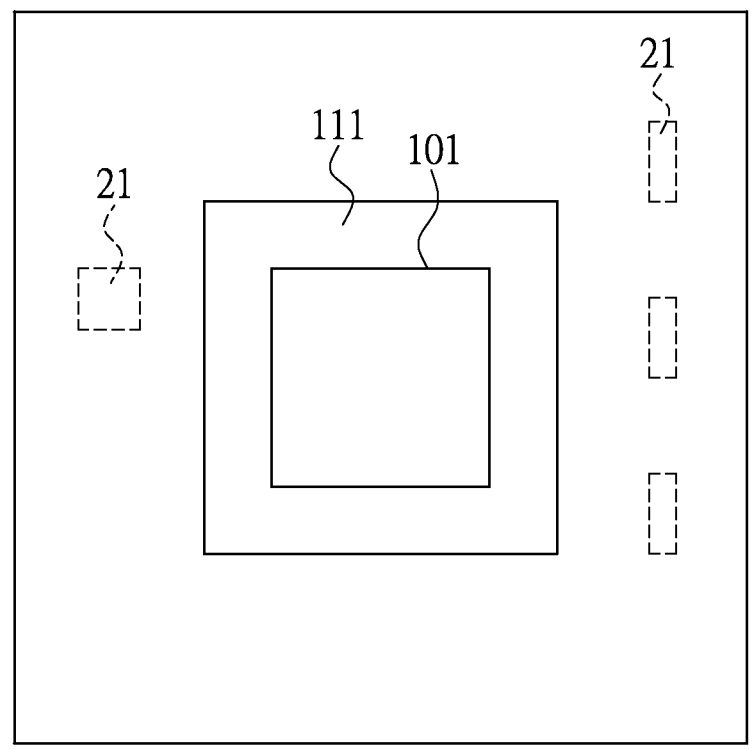

Please refer to FIGS. 1, 2G, and 2H. Once the tape 13 is removed (Step S107), molding 15 only remains on portions of the circuit substrate 11 other than the predetermined region 101. Moreover, the tape 13 can be a thermal tape which releases adhesion upon heat, whereas the UV tape releases adhesion upon UV light, but is not limited the examples provided herein. In one embodiment, the tape 13 can be thin film having a thickness approximately 20-50 microns (micrometers, μm) as an example.

Please refer to FIG. 1 as the flow chart. In another embodiment of the instant disclosure, the tape 13 can be a thick film having a thickness of 0.2 millimeter (mm). After at least one groove is laser-scribed onto the molding 15 according to the patterned predetermined region (Step S105), further trimming can be done on the molding 15 according to the patterned predetermined region (the molding 15 above the tape 13) (Step S106). In other words, the molding 15 on the patterned predetermined region 101 is removed, and then the tape 13 is removed. Thus, molding 15 only remains on portions of the circuit substrate 11 other than the predetermined region 101.

Figure 2I:
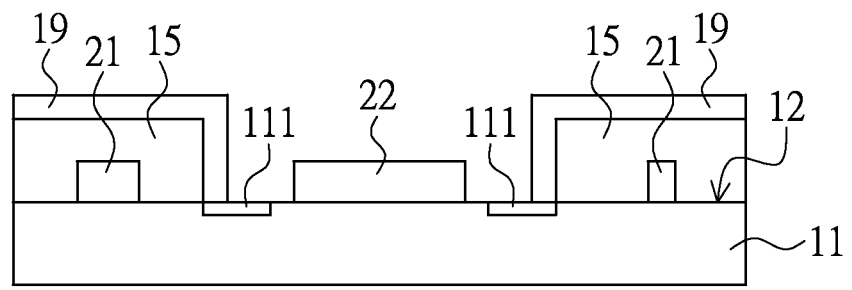

In another embodiment of the instant disclosure, once tape is removed, an electromagnetic shielding layer is formed over portions of the molding other than the predetermined region and is electrically connected to the ground pad. Then optical components are mounted in the predetermined region. In other embodiments, once the tape is removed, optical components can be first mounted in the predetermined region, then successively form the electromagnetic shielding layer over portions of the molding other than the predetermined region and then electrically connect to the ground pad. As shown in FIG. 2I, the electromagnetic shielding layer 19 and the ground pad 111 remain electrically connected such that electromagnetic shielding is provided. The electromagnetic shielding layer 19 can be formed by spray coating, electroless plating, or sputtering. The optical components are mounted on the predetermined region via method such as surface mount technology (SMT).

In summary, the instant disclosure provides a method of manufacturing electronic package module which facilitates selective molding. Selective molding is formed on the circuit substrate by attaching tape on the circuit substrate and traces, and then removing the tape along with the molding on the tape. Then a predetermined region is formed without molding thereon, and optical components not preferred to be molded are then mounted on the predetermined region. Thus, electromagnetic disturbance (EMI) is provided while preventing optical components from being encapsulated by molding, which affects normal operations.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. A method of manufacturing an electronic package module, comprising:
   providing a circuit substrate comprising:
      a mountable surface;
      at least one ground pad on the mountable surface; and
      at least one patterned predetermined region defined on the mountable surface;
   mounting at least one electronic component on at least one portion of the mountable surface other than the predetermined region;
   attaching at least one tape in the patterned predetermined region conforming to the shape of the patterned predetermined region;
   forming a molding over the mountable surface, wherein the molding covers the tape and the at least one electronic component;
   removing the molding formed on the patterned predetermined region;
   forming an electromagnetic shielding layer over the molding to electrically connect to the ground pad; and
   removing the tape, wherein removing the tape comprises providing heat to facilitate the removal of the tape,
   wherein after removing the tape, the method further comprises:
   mounting at least one optical component in the predetermined region.

2. The method of manufacturing the electronic package module as recited in claim 1 wherein the ground pad surrounds the patterned predetermined region.

3. A method of manufacturing an electronic package module, comprising:
   providing a circuit substrate comprising:
      a mountable surface;
      at least one ground pad on the mountable surface; and
      at least one patterned predetermined region defined on the mountable surface;
   mounting at least one electronic component on at least one portion of the mountable surface other than the predetermined region;
   attaching at least one tape in the patterned predetermined region conforming to the shape of the patterned predetermined region;
   forming a molding over the mountable surface, wherein the molding covers the tape and the at least one electronic component;
   removing the molding formed on the patterned predetermined region; and
   removing the tape, wherein removing the tape comprises providing heat to facilitate the removal of the tape,
   wherein after removing the tape, the method further comprises:

forming an electromagnetic shielding layer over the molding to electrically connect to the ground pad; and mounting at least one optical component in the predetermined region.

4. The method of manufacturing the electronic package module as recited in claim 3 wherein the ground pad surrounds the patterned predetermined region.

* * * * *